United States Patent
Zhang et al.

(10) Patent No.: US 11,538,535 B2
(45) Date of Patent: Dec. 27, 2022

(54) APPARATUS FOR RAPID DATA DESTRUCTION

(71) Applicant: MICRON TECHNOLOGY, INC., Boise, ID (US)

(72) Inventors: Zhengyi Zhang, San Jose, CA (US); Dan Xu, Sunnyvale, CA (US); Tomoko Ogura Iwasaki, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/443,370

(22) Filed: Jul. 26, 2021

(65) Prior Publication Data
US 2021/0366558 A1 Nov. 25, 2021

Related U.S. Application Data

(63) Continuation of application No. 16/895,025, filed on Jun. 8, 2020, now Pat. No. 11,087,851.

(60) Provisional application No. 62/955,315, filed on Dec. 30, 2019.

(51) Int. Cl.
| | | |
|---|---|---|
| *G11C 16/04* | (2006.01) | |
| *G11C 16/28* | (2006.01) | |
| *G11C 16/10* | (2006.01) | |
| *G11C 16/34* | (2006.01) | |
| *G11C 16/30* | (2006.01) | |

(52) U.S. Cl.
CPC .......... *G11C 16/28* (2013.01); *G11C 16/0483* (2013.01); *G11C 16/10* (2013.01); *G11C 16/30* (2013.01); *G11C 16/3404* (2013.01)

(58) Field of Classification Search
CPC ..... G11C 16/28; G11C 16/0483; G11C 16/10; G11C 16/30
USPC ....................................................... 365/185.2
See application file for complete search history.

(56) References Cited

U.S. PATENT DOCUMENTS

| | | | |
|---|---|---|---|
| 9,697,907 B2 | 7/2017 | Tanzawa | |
| 9,887,002 B1 | 2/2018 | Zhang | |
| 2008/0316825 A1 | 12/2008 | Hwang et al. | |
| 2012/0257450 A1* | 10/2012 | Yip | G11C 16/26 365/185.25 |
| 2016/0163390 A1* | 6/2016 | Park | G11C 16/26 365/185.11 |

* cited by examiner

*Primary Examiner* — Vu A Le
(74) *Attorney, Agent, or Firm* — Dicke, Billig & Czaja, PLLC

(57) ABSTRACT

Apparatus having a string of series-connected memory cells, a plurality of access lines with each access line of the plurality of access lines connected to a control gate of a respective memory cell of the plurality of memory cells, and a controller for access of the string of series-connected memory cells and configured to cause the memory to increase a threshold voltage of a particular memory cell of the string of series-connect memory cells to a voltage level higher than a predetermined pass voltage to be received by a control gate of the particular memory cell during a read operation on the string of series-connected memory cells, and concurrently change a respective data state of each memory cell of a plurality of memory cells of the string of series-connected memory cells.

24 Claims, 10 Drawing Sheets

```
                                                                    ┌─ 722
┌─────────────────────────────────────────────────────────────────┐/
│ Electrically Float a First Plurality of Access Lines and a Second Plurality │
│   of Access Lines, Wherein Each Access Line of the First Plurality of       │
│  Access Lines is Connected to a Respective Memory Cell of a String of       │
│ Series-Connected Memory Cells, Wherein the Respective Memory Cell           │
│   for Each Access Line of the First Plurality of Access Lines is Configured │
│   for Output of Data Using a Read Operation, Wherein Each Access Line       │
│    of the Second Plurality of Access Lines is Connected to a Respective     │
│       Memory Cell of the String of Series-Connected Memory Cells, and       │
│        Wherein the Respective Memory Cell for Each Access Line of the       │
│ Second Plurality of Access Lines is Configured to be Inaccessible Using     │
│                            a Read Operation                                 │
└─────────────────────────────────────────────────────────────────┘
                                   │
                                   ▼                                ┌─ 723
┌─────────────────────────────────────────────────────────────────┐/
│   Apply a First Programming Pulse to a Particular Access Line of the        │
│  Second Plurality of Access Lines While Electrically Floating Remaining     │
│     Access Lines of the Second Plurality of Access Lines and While          │
│         Electrically Floating the First Plurality of Access Lines           │
└─────────────────────────────────────────────────────────────────┘
                                   │
                                   ▼                                ┌─ 725
┌─────────────────────────────────────────────────────────────────┐/
│   Apply a Second Programming Pulse to Each Access Line of the First         │
│   Plurality of Access Lines While Applying a Pass Voltage to Each Access    │
│   Line of the Second Plurality of Access Lines Between Any Access Line      │
│   of the First Plurality of Access Lines and an End of the String of Series-│
│          Connected Memory Cells Opposite the Particular Access Line         │
└─────────────────────────────────────────────────────────────────┘
                                   ┊
                                   ▼                                ┌─ 727
┌ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┐/
│   Concurrently Erase the Respective Memory Cell for the Particular          │
│   Access Line and the Respective Memory Cell for Each Access Line of        │
│                      the First Plurality of Access Lines                    │
└ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┘
```

FIG. 7

APPARATUS FOR RAPID DATA DESTRUCTION

RELATED APPLICATIONS

This application is a Continuation of U.S. application Ser. No. 16/895,025, titled "APPARATUS AND METHODS FOR RAPID DATA DESTRUCTION," filed Jun. 8, 2020, (allowed) which is commonly assigned and incorporated herein by reference in its entirety and which claims the benefit of U.S. Provisional Application No. 62/955,315 filed on Dec. 30, 2019, hereby incorporated herein in its entirety by reference.

TECHNICAL FIELD

The present disclosure relates generally to integrated circuits, and, in particular, in one or more embodiments, the present disclosure relates to apparatus and methods for rapid data destruction.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

Although non-volatile memory is generally designed for long-term storage of data, there may be instances where rapid destruction of data is desired. For example, software developers might provide security keys to permit access to their software, but may desire that these security keys be destroyed immediately after use. However, erasing non-volatile memory can be a relatively time-consuming process, and typically uses relatively large amounts of power, relative to other operations of a memory.

BRIEF DESCRIPTION OF THE DRAWINGS

FIG. 7 is a method of operating a memory in accordance with a further embodiment.

DETAILED DESCRIPTION

Figure 1A:
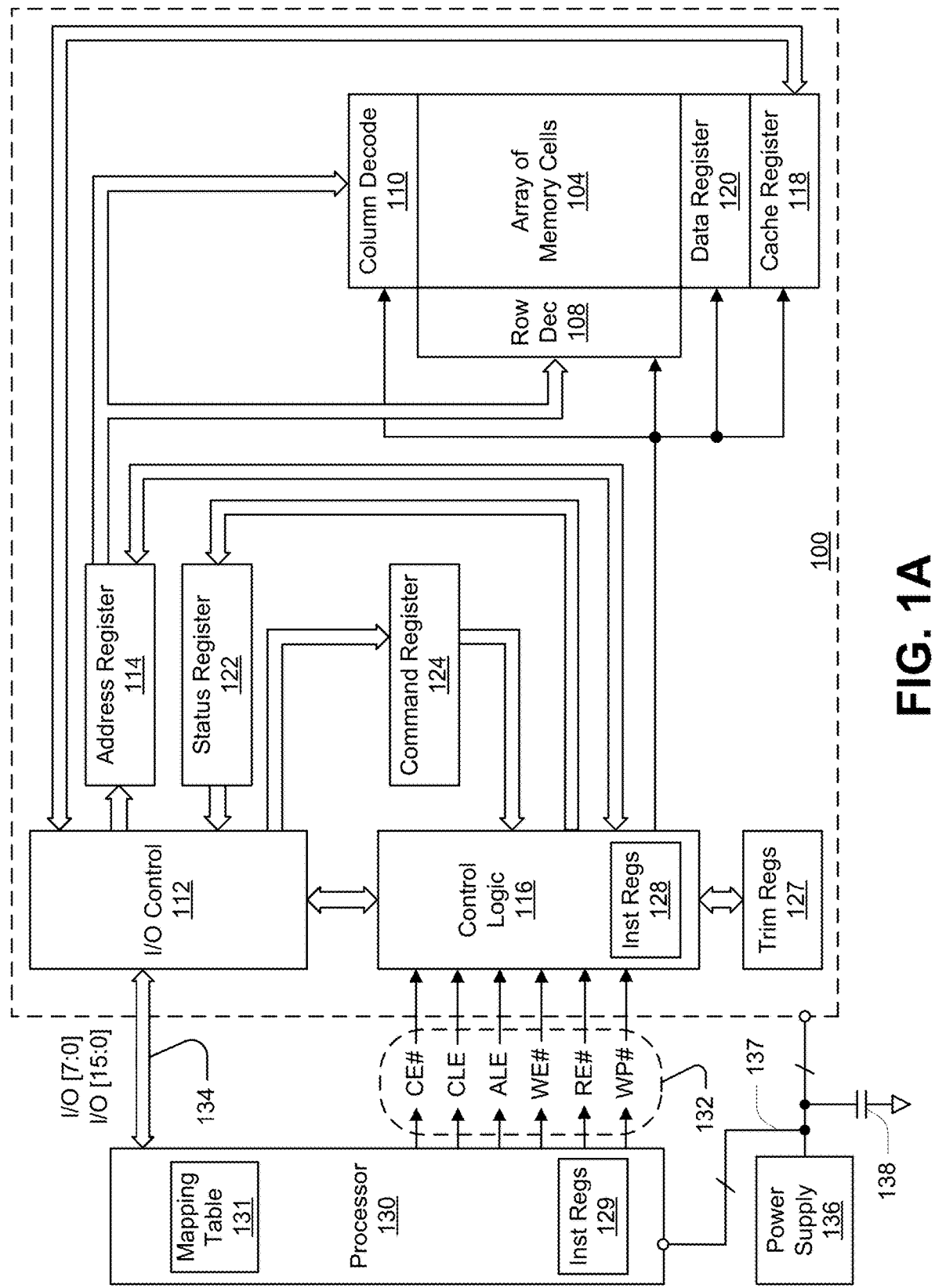
FIG. 1A is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1A is a simplified block diagram of a first apparatus, in the form of a memory (e.g., memory device) 100, in communication with a second apparatus, in the form of a processor 130, and a third apparatus, in the form of a power supply 136, as part of a fourth apparatus, in the form of an electronic system, according to an embodiment. For some embodiments, the power supply 136 may be external to an electronic system containing the processor 130 and the memory device 100. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device. The processor 130 might include a mapping table 131 to store logical-to-physical mapping information for the memory 100 if the processor 130 is to address the memory 100 using physical addresses, thus facilitating logical-to-physical address translation at the processor 130. If the processor 130 is to address the memory 100 using logical addresses, the mapping table 131 might be a portion of the memory 100, thus facilitating logical-to-physical address translation at the memory 100.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1A) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. Trim registers 127 may be in communication with the control logic 116 to store trim settings. Although depicted as a separate storage register, trim registers 127 might represent a portion of the array of memory cells 104. Trim settings are generally values used by an integrated circuit device to define values of voltages, control signals, timing, quantities, etc. to be used during operation of that integrated circuit device.

A controller (e.g., the control logic 116 internal to the memory device 100) controls access to the array of memory cells 104 in response to the commands and generates status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104. In addition, the processor 130 might also include instruction registers 129 which might represent computer-usable memory for storing computer-readable instructions. For some embodiments, the instruction registers 129 might represent firmware.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1A) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive node providing for electrical connection to the memory device 100 by an external device (e.g., processor 130), such as conductive pads or conductive bumps as are commonly used.

Memory device 100 and/or processor 130 might receive power from the power supply 136. Power supply 136 may represent any combination of circuitry for providing power to memory device 100 and/or processor 130. For example, power supply 136 might include a stand-alone power supply (e.g., a battery), a line-connected power supply (e.g., a switched-mode power supply common in desktop computers and servers or an AC adapter common for portable electronic devices), or a combination of the two.

Power is typically received from the power supply 136 using two or more voltage supply nodes 137, such as a supply voltage node (e.g., Vcc) and a reference voltage node (e.g., Vss or ground). It is not uncommon for a power supply 136 to provide more than two voltage supply nodes 137. For example, a common standard for switched-mode power supplies, ATX (Advanced Technology eXtended) 2.x, provides, using a 28-pin connection, four voltage supply nodes (or pins) at +3.3V, five voltage supply nodes at +5V, four voltage supply nodes at +12V, one voltage supply node at 12V, and ten voltage supply nodes at a reference voltage (e.g., 0V). The ATX 2.x standard further provides a power-on node for activating the foregoing voltage supply nodes when it is pulled to ground by an external circuit, a standby voltage supply node driven to +5V regardless of whether the other voltage supply nodes are being driven to their respective voltage levels (which can be used to power the external circuit responsible for pulling the power-on node to ground), and a power-good node for indicating when the other voltage supply nodes are stabilized at their respective voltages. The remaining pin of the ATX 2.x 28-pin standard is undefined. Memory device 100 and processor 130 may utilize differing combinations of voltage supply nodes 137 from power supply 136 depending upon their respective power needs. For simplicity, distribution of power from the voltage supply nodes 137 to components within the memory device 100 is not depicted.

The voltage supply nodes 137, or other components of the electronic system, might have an inherent or added energy storage device, such as capacitance 138, e.g., a hold-up capacitance, that can provide power to the memory device 100, and optionally to the processor 130, for some finite amount of time in the case of failure or removal of the power supply 136. Sizing of the capacitance 138 can be readily determined based on the power requirements of at least the memory device 100 for the operations described herein. While the energy storage device is depicted as the capacitance 138 in examples herein, the capacitance 138 could alternatively represent a battery. Furthermore, while the capacitance 138 is depicted to be external to the memory device 100, it could alternatively be an internal component of the memory device 100.

It will be appreciated by those skilled in the art that additional circuitry and signals can be provided, and that the memory device 100 of FIG. 1A has been simplified. It should be recognized that the functionality of the various block components described with reference to FIG. 1A might not necessarily be segregated to distinct components or component portions of an integrated circuit device. For example, a single component or component portion of an integrated circuit device could be adapted to perform the functionality of more than one block component of FIG. 1A. Alternatively, one or more components or component portions of an integrated circuit device could be combined to perform the functionality of a single block component of FIG. 1A.

Additionally, while specific I/O pins are described in accordance with popular conventions for receipt and output of the various signals, it is noted that other combinations or numbers of I/O pins (or other I/O node structures) might be used in the various embodiments.

Figure 1B:
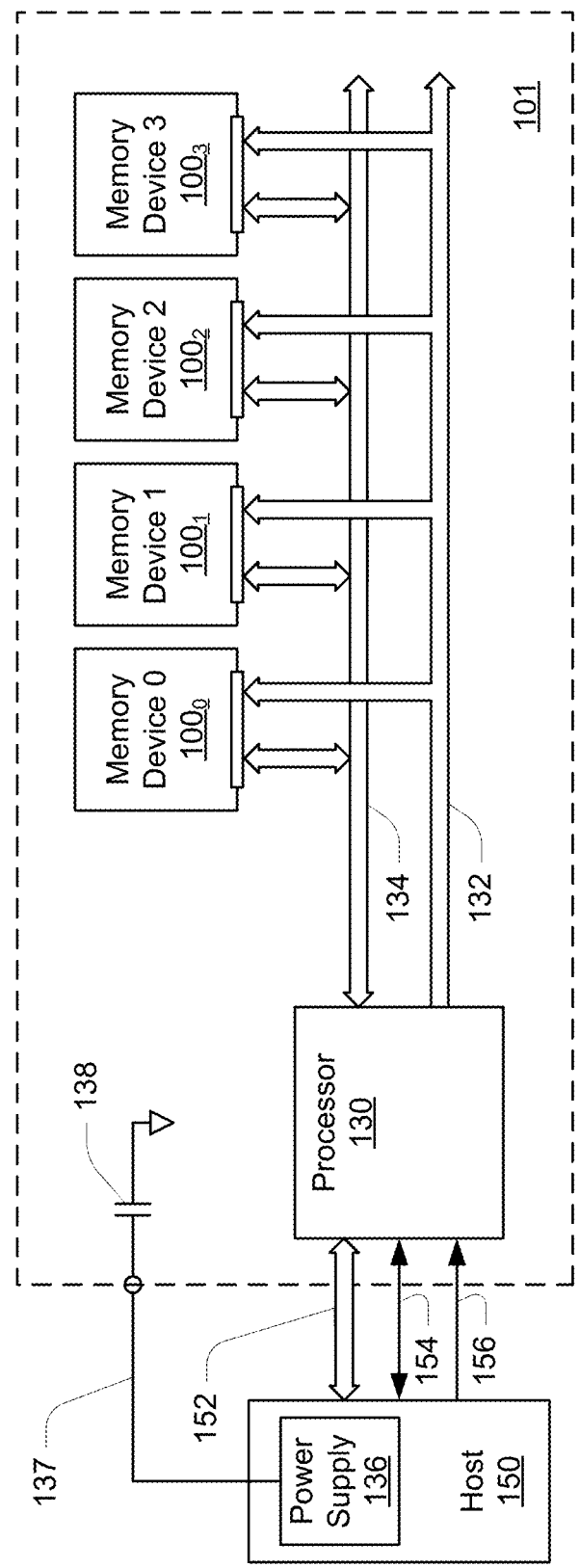
FIG. 1B is a simplified block diagram of an apparatus in the form of a memory module in communication with a host as part of an electronic system, according to another embodiment.

A given processor 130 might be in communication with one or more memory devices 100, e.g., dies. FIG. 1B is a simplified block diagram of an apparatus in the form of a memory module 101 in communication with a host 150 as part of an electronic system, according to another embodiment. Memory devices 100, processor 130, control link 132, I/O bus 134, power supply 136, voltage supply nodes 137 and capacitance 138 may be as described with reference to FIG. 1A. For simplicity, distribution of power from the voltage supply nodes 137 to the memory devices 100 and processor 130 within the memory module 101 is not depicted. Although memory module (e.g., package) 101 of FIG. 1B is depicted with four memory devices 100 (e.g., dies), memory module 101 could have some other number of one or more memory devices 100.

Because processor 130 (e.g., a memory controller) is between the host 150 and the memory devices 100, communication between the host 150 and the processor 130 may involve different communication links than those used between the processor 130 and the memory devices 100. For example, the memory module 101 might be an Embedded MultiMediaCard (eMMC) of a solid state drive (SSD). In accordance with existing standards, communication with an eMMC might include a data link 152 for transfer of data (e.g., an 8-bit link), a command link 154 for transfer of commands and device initialization, and a clock link 156 providing a clock signal for synchronizing the transfers on the data link 152 and command link 154. The processor 130 might handle many activities autonomously, such as power-loss detection, error correction, management of defective blocks, wear leveling and address translation.

Figure 2A:
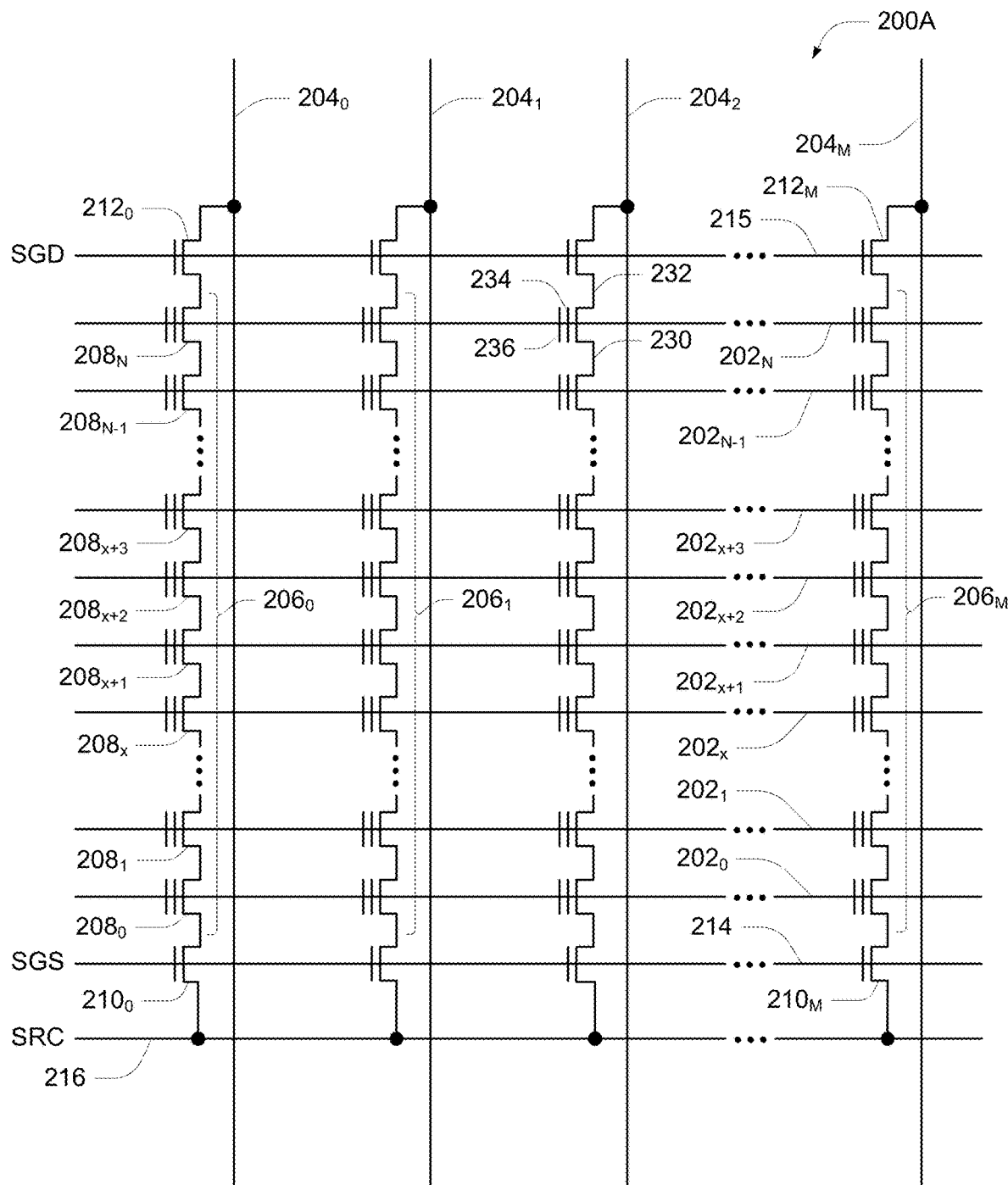
FIGS. 2A-2B are schematics of portions of an array of memory cells as could be used in a memory of the type described with reference to FIG. 1A.

FIG. 2A is a schematic of a portion of an array of memory cells 200A, such as a NAND memory array, as could be used in a memory of the type described with reference to FIG. 1A, e.g., as a portion of array of memory cells 104. Memory array 200A includes access lines, such as word lines $202_0$ to $202_N$, and data lines, such as bit lines $204_0$ to $204_M$. The word lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the bit lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) a word line 202.

A column of the memory cells 208 might be a NAND string 206 or a plurality of NAND strings 206 selectively connected to a given bit line 204. A row of the memory cells 208 might be memory cells 208 commonly connected to a given word line 202. A row of memory cells 208 can, but need not, include all memory cells 208 commonly connected to a given word line 202. Rows of memory cells 208 might often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) might be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) might be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A might be numbered consecutively from bit line $204_0$ to bit line $204_M$. Other groupings of memory cells 208 commonly connected to a given word line 202 might also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
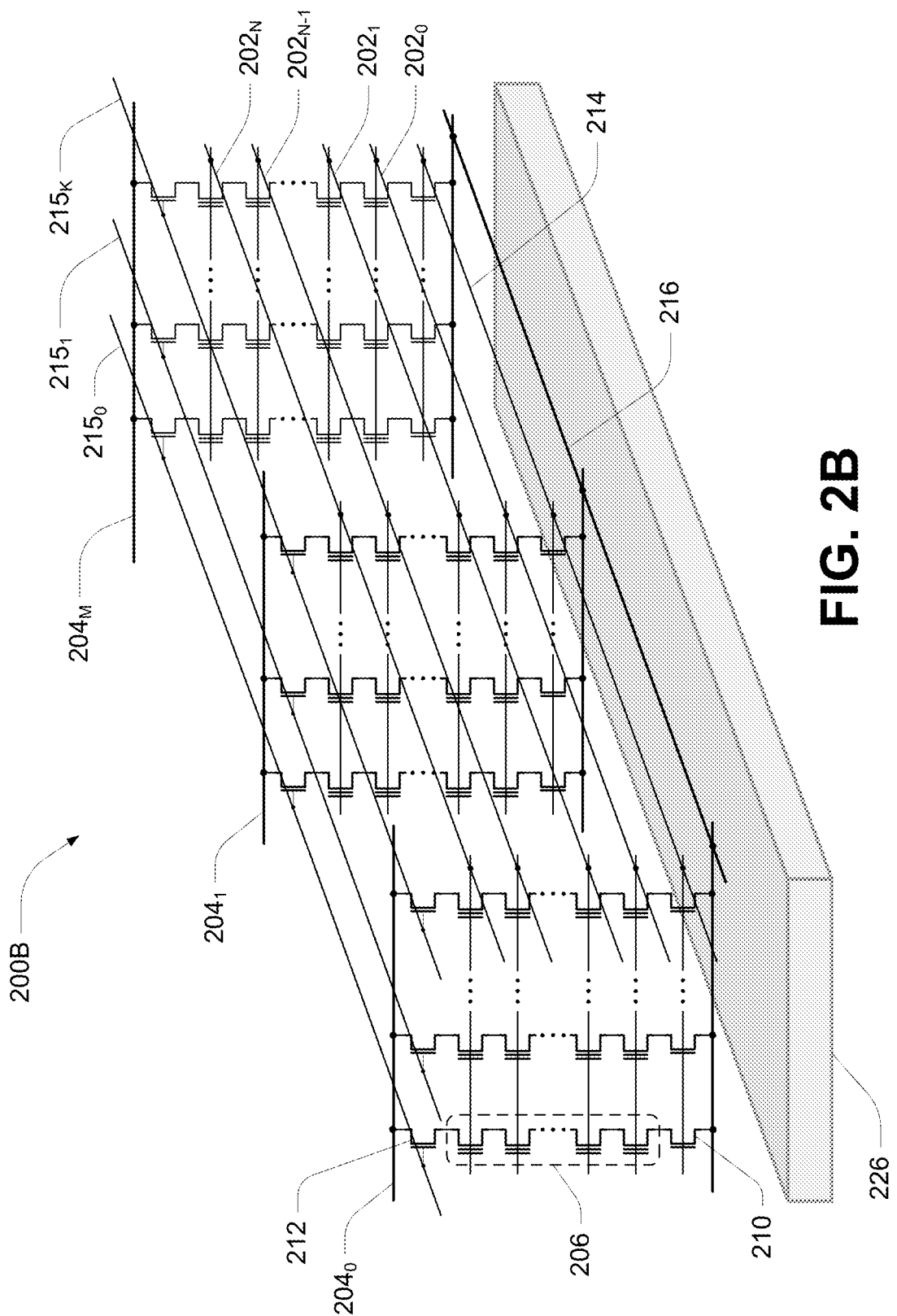

FIG. 2B is another schematic of a portion of an array of memory cells 200B as could be used in a memory of the type described with reference to FIG. 1A, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a bit line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 might be connected to multiple rows of memory cells of the memory array 200B. Rows of memory cells that are commonly connected to each other by a particular word line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 3:
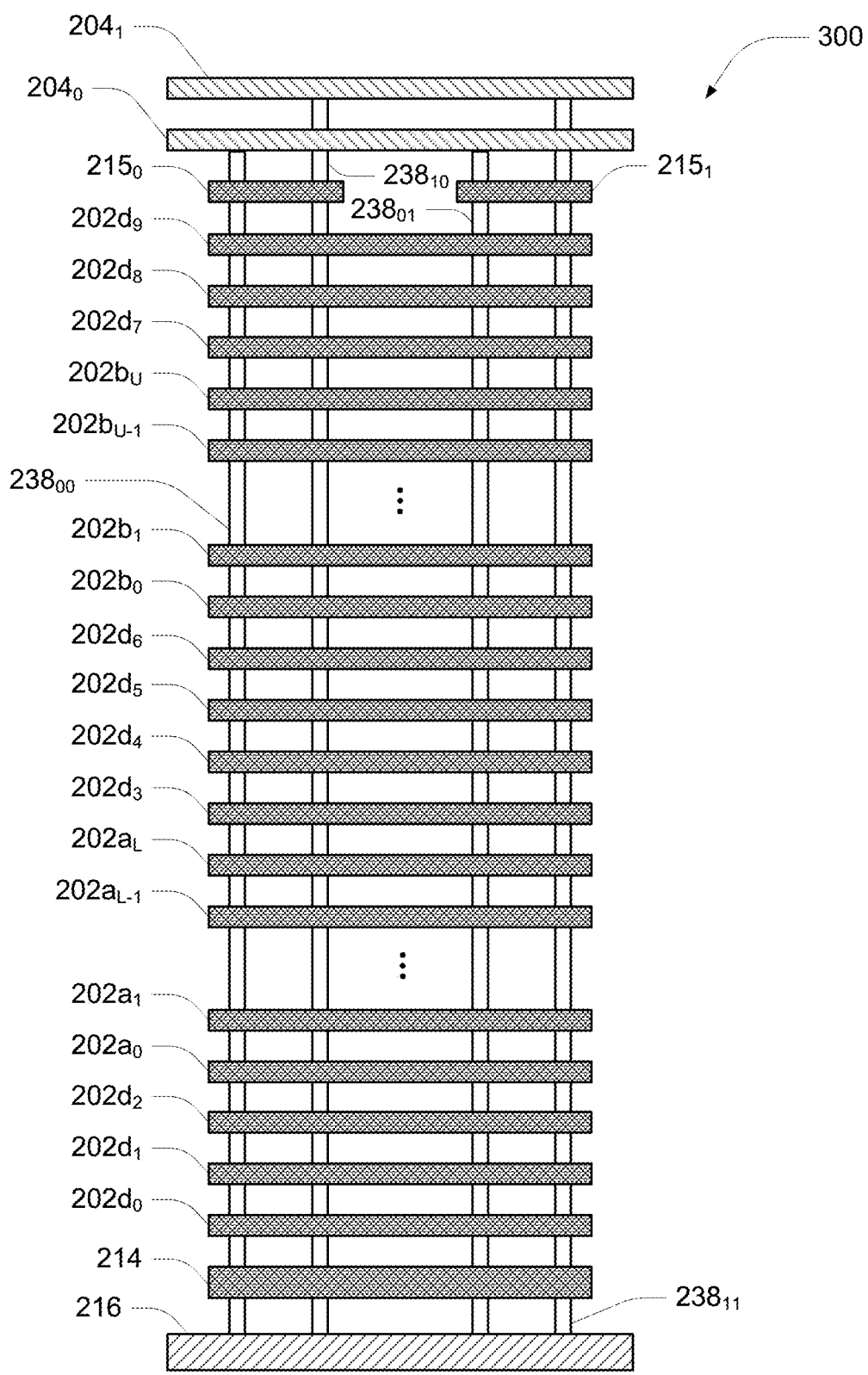
FIG. 3 is a conceptual depiction of a portion of a block of memory cells as could be used in a memory of the type described with reference to FIG. 1A.

FIG. 3 is a conceptual depiction of a portion of a block (e.g., physical block) of memory cells 300 as could be used in a memory of the type described with reference to FIG. 1A. Data Lines $204_0$ and $204_1$ of FIG. 3 might correspond to data lines $204_0$ and $204_1$ of FIG. 2B. Channel regions $238_{00}$ and $238_{01}$ might represent the channel regions of different strings of series-connected memory cells (e.g., NAND strings 206 of FIGS. 2A-2B) selectively connected to the data line $204_0$ in response to select lines $215_0$ and $215_1$, respectively. Similarly, channel regions $238_{10}$ and $238_{11}$ might represent the channel regions of different strings of series-connected memory cells (e.g., NAND strings 206 of FIGS. 2A-2B) selectively connected to the data line $204_1$ in response to select lines $215_0$ and $215_1$, respectively. The access lines $202_0$-$202_N$ depicted in FIG. 2A might be represented in FIG. 3 by the access lines $202d_0$-$202d_2$, $202a_0$-$202a_L$, $202d_3$-$202d_6$, $202b_0$-$202b_U$, and $202d_7$-$202d_9$, where N might be equal to L+U+12 in this example. A memory cell (not depicted in FIG. 3) might be formed at each intersection of an access line 202 and a channel region 238, and the memory cells corresponding to a single channel region might collectively form a string of series-connected memory cells (e.g., a NAND string 206 of FIGS. 2A-2B).

Access lines $202a_0$-$202a_L$ and $202b_0$-$202b_U$ and might correspond to memory cells intended to store user data. As used herein, user data will include data provided to the memory for storage in response to a write command, and for retrieval and output in response to a read command, as well as any associated overhead data, which might include error correction code (ECC) data corresponding to the provided data, for example. Such memory cells intended to store user data, and their respective access lines, will be referred to herein as principal memory cells and principal access lines, respectively.

Access lines $202d_0$-$202d_9$ might represent dummy access lines, and might correspond to dummy memory cells, e.g., memory cells not intended to store user data. While ten dummy access lines 202d are depicted, other numbers might be used. Dummy memory cells are not used to store user data and are typically not accessible to a user of the memory. Instead, dummy memory cells are typically incorporated into the string of series-connected memory cells for operational advantages. For example, memory cells formed near the source 216 and memory cells formed near a data line 204, e.g., memory cells corresponding to dummy access lines $202d_0$-$202d_2$ and $202d_7$-$202d_9$, might have different operating characteristics than memory cells formed farther away. By operating these memory cells as dummy memory cells, such differences in operating characteristics might generally be mitigated. In addition, dummy memory cells can be used to buffer select gates from high voltage levels that might be applied to principal memory cells during certain operations.

As the number of access lines 202 between a common source 216 and a data line 204 becomes larger, e.g., in response to increasing demands for memory capacity, physical limitations of technology may warrant forming the structure of the channel regions 238 in two parts as the aspect ratio of the hole might become too large to form the entire structure reliably as a contiguous entity. As an example, the structure of the block of memory cells 300 might be formed to include up to access line $202d_4$ before a first portion of a channel region 238 is formed, and then a subsequent portion of the block of memory cells 300 might be formed to include up to the select lines 215 before a remaining portion of the channel region 238 is formed. To improve the conductivity between the two portions of the channel region 238, a conductive region might be formed between them. However, this might lead to different operating characteristics of the memory cells formed near this conductive region, e.g., memory cells corresponding to dummy access lines $202d_3$-$202d_4$ and $202d_5$-$202d_6$, such as is common for memory cells nearest the common source 216 and those nearest a data line 204. By operating these memory cells also as dummy memory cells, such differences in their operating characteristics might generally be mitigated.

Dummy memory cells at the end of a NAND string 206 may be referred to as edge dummy memory cells, such as those dummy memory cells corresponding to source-side edge dummy access lines $202d_0$-$202d_2$, and those dummy memory cells corresponding to drain-side edge dummy access lines $202d_7$-$202d_9$. Dummy memory cells interposed between principal memory cells may be referred to as intermediate dummy memory cells, such as those dummy memory cells corresponding to intermediate dummy access lines $202d_3$-$202d_6$.

Various embodiments facilitate rapid destruction of data relative to the related art. In typical memory systems, it is common for logical addresses of the memory system to correspond to different physical locations at different times. For example, if a first physical block of memory cells contains data corresponding to a logical address, and that data needs to be modified, the data to be modified might be written to a second physical block of memory cells along with the unmodified data from the first physical block of memory cells. Although the logical address does not change, the physical address would change. Similarly, housekeeping operations, such as wear leveling, might be performed, which might also change the physical address corresponding to a logical address.

Figure 4:
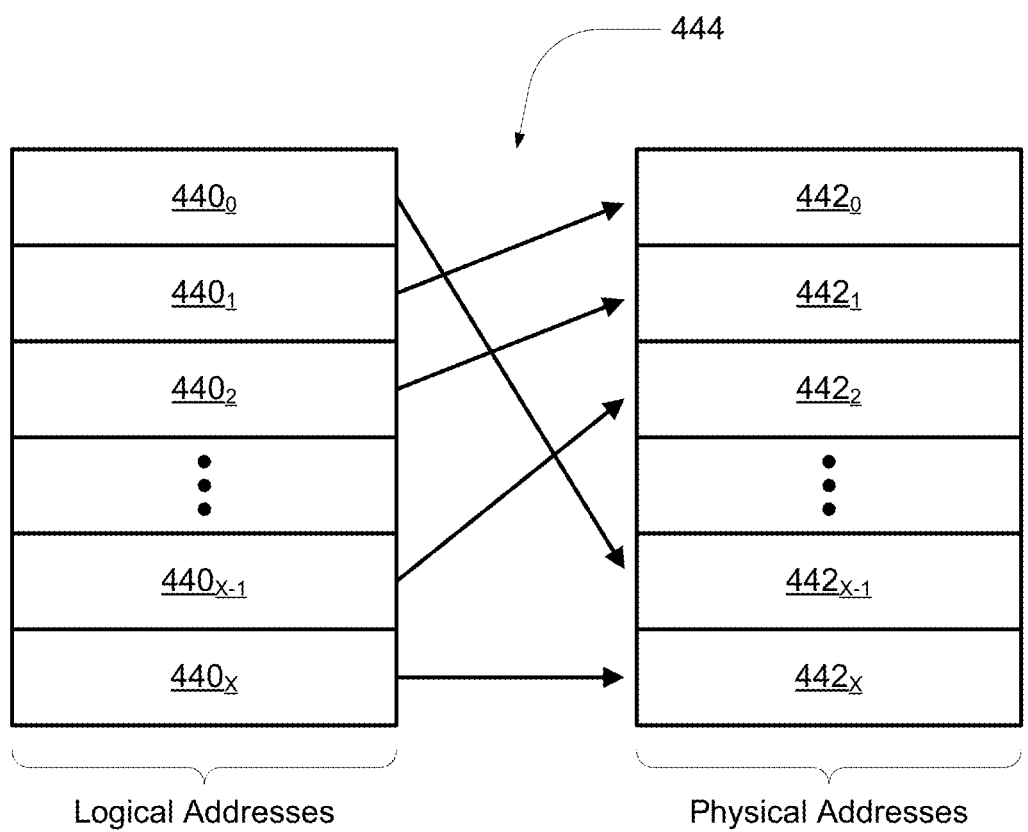
FIG. 4 is a conceptual example of logical-to-physical address translation as used in the related art.

To maintain a relationship between the logical address and the physical address, a translation layer might be provided. FIG. 4 is a conceptual example of logical-to-physical address translation as used in the related art.

In FIG. 4, a correspondence between logical addresses 440 of a memory system and physical addresses 442 of the memory system might be provided by pointers 444. For example, the logical address $440_0$ might correspond to the physical address $442_{X-1}$, the logical address $440_1$ might correspond to the physical address $442_0$, the logical address $440_2$ might correspond to the physical address $442_1$, and so on. In the related art, destruction of data might include deleting the pointers 444 corresponding to logical addresses intended for data destruction. Following deletion of the pointers 444, the memory cells of the corresponding physical addresses might be erased.

While deletion of the pointers 444 might make the data difficult to locate, that data would still remain in the memory system until it is erased. This might be considered a security risk. Erasing memory cells in typical NAND memory might take on the order of 10 ms per block of memory cells. If a large number of blocks of memory cells are intended for erasure, some data might be available for an extended period of time. This might be considered a security risk as there are means to read physical blocks of memory cells without reference to a logical address.

Various embodiments facilitate rapid destruction of data by programming a particular dummy memory cell (e.g., an edge dummy memory cell) to have a threshold voltage sufficient to make its corresponding string of series-connected memory cells inaccessible during a read operation (e.g., a read operation in a normal operating mode). This might be performed concurrently with deleting of pointers. As used herein, a read operation, which includes output of read data from the memory, is distinguished from a verify operation, which is utilized during a programming or erase operation to determine whether a memory cell has an intended data state, and does not include output of data from the memory.

Programming of the particular dummy memory cell might include a programming pulse (e.g., a single programming pulse) intended to increase the threshold voltage of the particular dummy memory cell to a voltage level higher than a predetermined control gate voltage to be applied to the particular dummy memory cell during a read operation. In general, such voltage levels to be applied during a read operation are predefined by storing values to trim registers of the memory, e.g., the trim registers 127. Storage of such trim values is generally performed during testing following fabrication of the memory. While it is known to provide for adjusting such stored trim values, e.g., in response to ambient temperature, to a number of program-erase cycles applied to a memory cell, to a number of bit errors, etc., such adjusting of trim values is typically performed autonomously by the memory itself and is generally inaccessible to a user of the memory. As such, by increasing the threshold voltage of the particular dummy memory cell to a voltage level higher than its control gate voltage of a read operation, current flow through the string of series-connected memory cells during the read operation might be inhibited regardless of the data state of the selected memory cell of the read operation, such that data states of the principal memory cells of that string of series-connected memory cells might be indeterminable by a user of the memory. As a result, reading or copying of such blocks of memory cells might be unavailable to a user of the memory.

In contrast to erasing a block of memory cells, such programming of dummy memory cells for the block of memory cells might take on the order of 10 μs, or three orders of magnitude less than erasing the block of memory cells. And while the data of the block of memory cells might still remain, a user might have no practicable method of accessing that data, which could facilitate an increased level of security over the related art, whether or not the pointers are deleted.

Programming the particular dummy memory cell might be followed by concurrently programming principal memory cells of the string of series-connected memory cells. Such programming of principal memory cells might include a programming pulse (e.g., a single programming pulse) intended to increase threshold voltages of at least a portion of those principal memory cells.

Data to be written to strings of series-connected memory cells is typically randomized prior to programming. Data randomization is often used to mitigate coupling effects between closely neighboring memory cells that can disturb the intended data states. While generally referred to as data randomization in the art, it is recognized that the data is not truly randomized in a mathematical sense. Instead, randomization generally refers to a redistribution of data values in a reversible manner. As a result of data randomization, each possible data state to which a memory cell can be programmed in a programming operation might be programmed to a similar (e.g., the same) number of memory cells. For example, where 4K (e.g., 4096) memory cells are each programmed to one of sixteen possible data states (e.g., data states L0-L15), each possible data state might be expected to programmed to a number of memory cells substantially equal to (e.g., equal to) 256 (e.g., 4096/16) memory cells where data randomization is utilized. As such, if principal memory cells storing randomized data have their threshold voltages increased, e.g., have their data states changed, the randomization might no longer be reversible in a manner that produces a meaningful result, which might make their intended data states indeterminable to a user of the memory.

In addition, regardless of whether data randomization is utilized, if a sufficient number of principal memory cells have their threshold voltages increased, e.g., have their data states changed, such that error correction is unavailable, the intended data states of those memory cells might become indeterminable on this basis as well. For example, it is common to utilize error correction of read data, as erroneous digits of data are typically expected due to charge loss, defective memory cells, etc. However, error correction schemes generally have limits on the number of errors they can detect and/or correct. As such, even if a user of the memory were able to read the principal memory cells of the string of series-connected memory cells containing the particular dummy memory cell, the intended data states of those principal memory cells might be indeterminable to a user of the memory.

In contrast to erasing a block of memory cells, such concurrent programming of principal memory cells for the block of memory cells might take on the order of less than 100 μs, or one or more orders of magnitude less than erasing the block of memory cells. This also could facilitate an increased level of security over the related art, whether or not the pointers are deleted.

Concurrent programming of the principal memory cells might be followed by concurrently erasing the particular dummy memory cell and the principal memory cells. Erasing memory cells might generally involve applying a voltage difference between control gates of those memory cells and a channel region of those memory cells that would be expected to decrease a threshold voltage (e.g., remove electrons from data storage structures) of those memory cells. Typically, this involves applying a positive voltage level (e.g., a high positive voltage level) to the channel region of the memory cells, e.g., by applying positive voltage levels to a data line and source selectively connected to the memory cells, and applying a positive voltage level (e.g., a low positive voltage level) or ground to the control gates of the memory cells. As one example, an erase voltage applied to the source and data line might be 16V, while the control gate voltages applied to the memory cells intended to be erased might be 0V. However, such voltage levels to be applied to memory cells intended to be erased might generally be dependent upon the structure and material characteristics of the memory cells.

Figure 5:
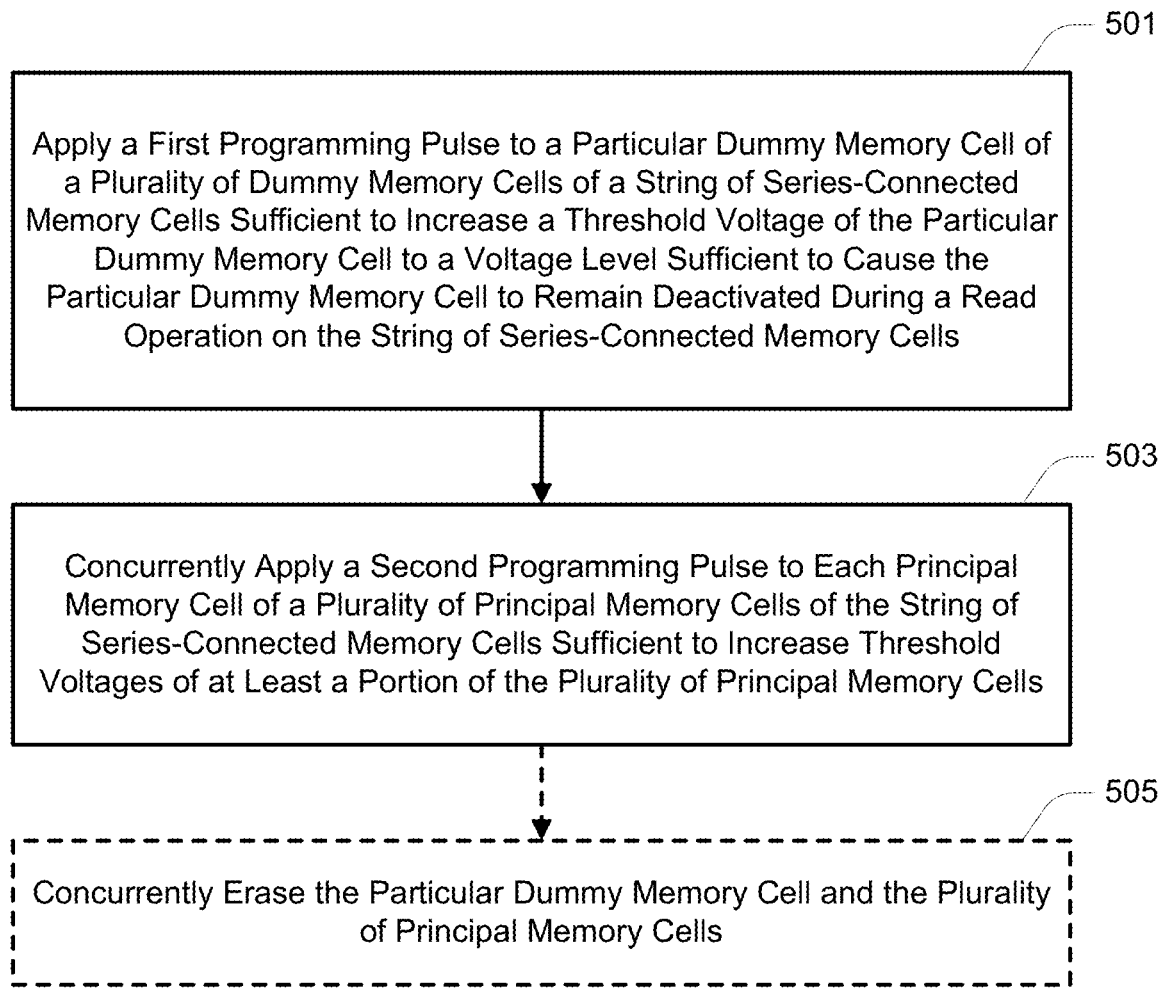
FIG. 5 is a method of operating a memory in accordance with an embodiment.

FIG. 5 is a method of operating a memory in accordance with an embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 501, a first programming pulse (e.g., a single first programming pulse) might be applied to a particular dummy memory cell of a plurality of dummy memory cells of a string of series-connected memory cells sufficient to increase a threshold voltage of the particular dummy memory cell to a voltage level sufficient to cause the particular dummy memory cell to remain deactivated during a read operation on the string of series-connected memory cells. It is expected that a single programming pulse can be sufficient to increase the threshold voltage of the particular dummy memory cell. However, additional programming pulses could also be used.

During a read operation on a string of series-connected memory cells of a structure such as depicted in FIG. 3, it might be common to connect the string of series-connected memory cells to the common source and to its respective data line, and to apply pass voltages to each memory cell of the string of series-connected memory cells (e.g., both dummy memory cells and principal memory cells) other than a principal memory cell selected for the read operation. These pass voltages might have different voltage levels for different memory cells, but each pass voltage would be intended to activate its respective memory cell. The selected principal memory cell might then receive one or more read voltages (e.g., of increasing voltage levels), where each read voltage corresponds to a different data state. In an increasing sequence of read voltages, the selected principal memory cell might be deemed to have the data state corresponding to the first read voltage that results in activation of the selected principal memory cell.

Dummy memory cells might have threshold voltages different than (e.g., lower than) threshold voltages corresponding to a highest data state used for storing data to principal memory cells. As such, their pass voltages might be lower than or equal to pass voltages used for principal memory cells. Table 1 provides one example of pass voltages with reference to FIG. 3.

TABLE 1

| Access Line | Pass Voltage |
|---|---|
| $202a_1$ | Vpass |
| $202a_0$ | Vpass |
| $202d_2$ | V3 = Vpass |
| $202d_1$ | V2 < V3 |
| $202d_0$ | V1 < V2 |

As one example, Vpass might equal 7.5V, V3 might equal 7.5V, V2 might equal 6V, and V1 might equal 5V. Using the foregoing voltage levels as an example, and assuming the particular dummy memory cell is a dummy memory cell corresponding to the dummy access line $202d_0$, increasing its threshold voltage to a voltage level higher than 5V (e.g., increasing its threshold voltage to 6V) would result in deactivation of the particular dummy memory cell during the read operation when that dummy memory cell receives its predetermined control gate voltage.

For some embodiments, the particular dummy memory cell is an edge dummy memory cell. This might facilitate an increase in programming speed over use of an intermediate dummy memory cell as the path to charge carriers (e.g., electrons) might be shorter and of less resistance. In addition, this might facilitate a reduction in power requirements over use of an intermediate dummy memory cell. For example, to program an intermediate dummy memory cell, a current path to one end of the string of series-connected memory cells might be required, which might require the activation of any principal memory cells between that intermediate dummy memory cell and the end of the string of series-connected memory cells. Use of an edge dummy memory cell might not require activation of any principal memory cells. Where the edge dummy memory cell is the closest edge dummy memory cell to the end of the string of series-connected memory cells, e.g., the memory cell corresponding to edge dummy access line $202d_0$ or $202d_9$ in the example of FIG. 3, programming of the edge dummy memory cell might not require activation of any other dummy memory cells. Assuming the particular dummy memory cell is a memory cell connected to the edge dummy access line $202d_0$, the particular dummy memory cell might be programmed by applying a programming pulse (e.g., a single programming pulse) to the edge dummy access line $202d_0$ while the source select line 214 receives a voltage level configured to activate its corresponding source select gate, and while the remaining access lines of the string of series-connected memory cells are allowed to electrically float.

At 503, a second programming pulse (e.g., a single second programming pulse) might be concurrently applied to each principal memory cell of a plurality of principal memory cells of the string of series-connected memory cells sufficient to increase threshold voltages of at least a portion of the plurality of principal memory cells. The second programming pulse might have a voltage level lower than a voltage level of the first programming pulse.

Assuming the particular dummy memory cell is a memory cell connected to the edge dummy access line $202d_0$, dummy memory cells between any principal memory cell and an opposite end of the string of series-connected memory cells (e.g., the end nearest the data line in this example) might receive voltage levels configured to activate those dummy memory cells while applying the second programming pulse to the principal memory cells (e.g., applying the second programming pulse to their corresponding principal access lines), and the corresponding drain select line 215 might receive a voltage level configured to activate its corresponding drain select gate. Voltage levels for remaining dummy memory cells, e.g., the dummy memory cells connected to the dummy access lines $202d_0$-$202d_2$ in this example, might be generally inconsequential to the programming of the principal memory cells. One or more of these remaining dummy memory cells might be deactivated, and one or more of these dummy memory cells might be activated. For one embodiment, the particular dummy memory cell might be deactivated, and remaining dummy memory cells between the particular dummy memory cell and a nearest principal memory cell might be activated. In general, the source select line 214 might receive a voltage level configured to deactivate its corresponding source select gate in this example.

The second programming pulse might be expected to increase the threshold voltage of any principal memory cell having a threshold voltage lower than a particular voltage level. It is expected that a single programming pulse can be sufficient to increase the threshold voltage of the principal memory cells such that their intended data state might be indeterminable. However, additional programming pulses could also be used.

The particular voltage level might be some value above a mid-point of a read window for the principal memory cells. The read window might represent a range of read voltages used to determine with data state of a plurality of data states a memory cell might have. For example, the voltage level of the bottom of the read window might be a voltage level used to determine whether a memory cell has a lowest data state of the plurality of data states, e.g., has a threshold voltage lower than the voltage level of the bottom of the read window. Similarly, the voltage level of the top of the read window might be a voltage level used to determine whether a memory cell has a highest data state of the plurality of data states, e.g., has a threshold voltage higher than the voltage level of the top of the read window.

As one example, consider a read window having a range from a bottom voltage level (Vbot) of −1V to a top voltage level (Vtop) of 5V. A mid-point might be 2V, or Vbot+0.5*(Vtop−Vbot). The voltage level of the second programming pulse might then be selected such that principal memory cells having threshold voltages lower than 3V might be expected to experience an increase in threshold voltage in response to applying the second programming pulse. For some embodiments, the voltage level of the second programming pulse might be selected such that principal memory cells having threshold voltages lower than Vbot+0.75*(Vtop−Vbot) might be expected to experience an increase in threshold voltage in response to applying the second programming pulse.

For some embodiments, the voltage level of the second programming pulse might be selected such that a number of the principal memory cells receiving the second programming pulse that are expected to experience a change of data state exceeds an error correction capability of an error correction scheme used by the memory. For further embodiments, the voltage level of the second programming pulse might be selected such more than half of the principal memory cells receiving the second programming pulse might be expected to experience a change of data state.

At 505, the particular dummy memory cell and the plurality of principal memory cells (e.g., each principal memory cell of the plurality of principal memory cells) might be concurrently erased. Such erasure can be a standard erase operation used by the memory, and can further include erasing each dummy memory cell of the string of series-connected memory cells. Because of the changes effected by 501 and 503, erasing these memory cells might be part of standard housekeeping of the memory, e.g., as used in the reclamation of blocks of memory cells containing obsolete data. Alternatively, erasing these memory cells at 505 might be performed immediately subsequent to 503.

Although the method of FIG. 5 was described with reference to a single string of series-connected memory cells, the method might be concurrently performed for each string of series-connected memory cells of a block of memory cells. For example, with reference to FIG. 3, the method might be performed concurrently for each string of series-connected memory cells having a source select gate connected to the source select line 214. Alternatively, the method might be performed concurrently for each string of series-connected memory cells having a drain select gate connected to a particular drain select line 215.

Figure 6:
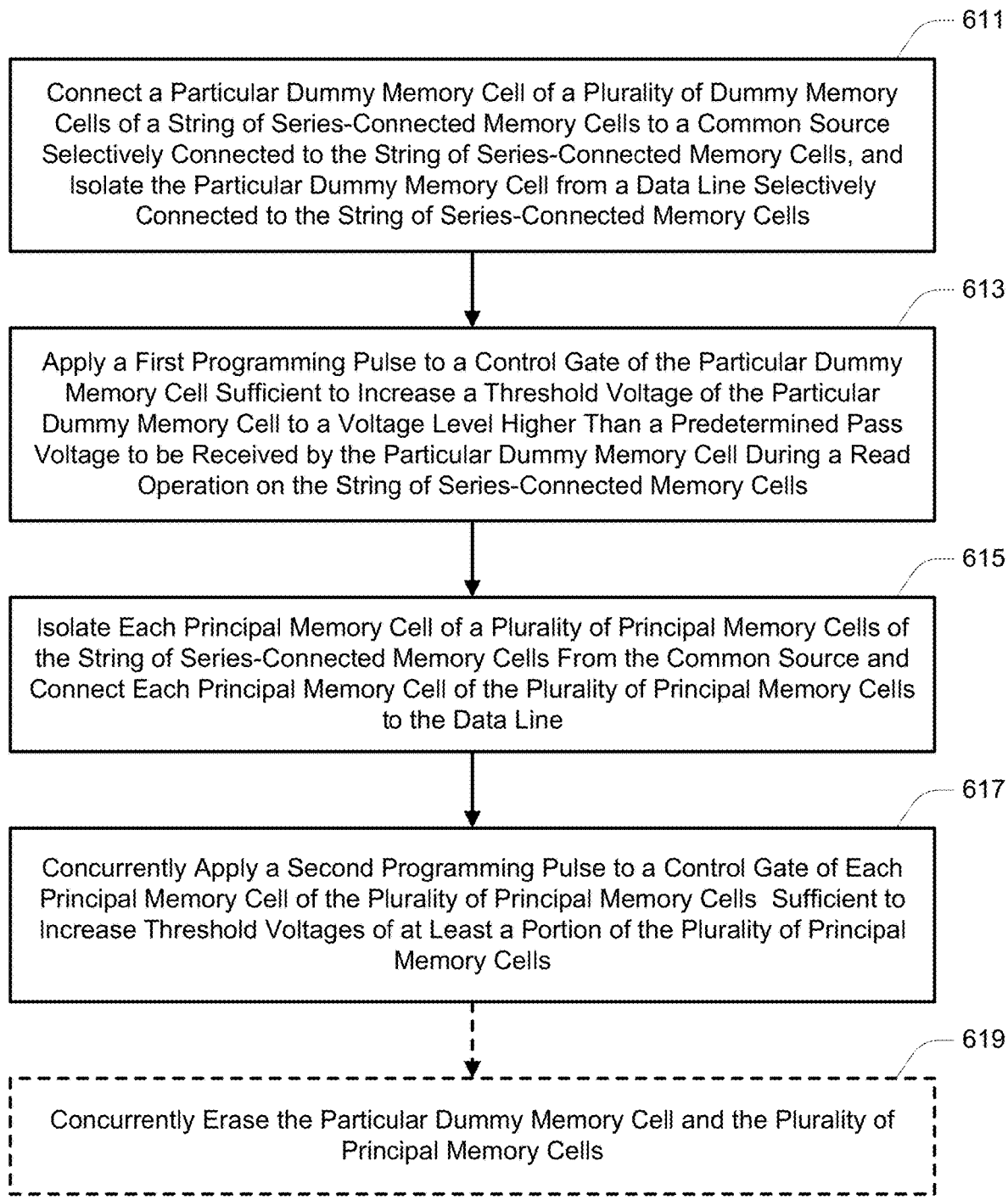
FIG. 6 is a method of operating a memory in accordance with another embodiment.

FIG. 6 is a method of operating a memory in accordance with another embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 611, a particular dummy memory cell of a plurality of dummy memory cells of a string of series-connected memory cells might be connected to a common source selectively connected to the string of series-connected memory cells, and might be isolated from a data line selectively connected to the string of series-connected memory cells. Assuming the particular dummy memory cell is a memory cell connected to the edge dummy access line $202d_0$, this might include electrically floating all access lines connected to memory cells of the string of series-connected memory cells, e.g., all dummy access lines and all principal access lines, other than the dummy access line $202d_0$. This might further include electrically floating the corresponding drain select line 215, and applying a voltage level to the source select line 214 configured to activate its corresponding source select gate.

At 613, a first programming pulse (e.g., a single first programming pulse) might be applied to the particular dummy memory cell sufficient to increase a threshold voltage of the particular dummy memory cell to a voltage level higher than a predetermined pass voltage to be received during a read operation on the string of series-connected memory cells. It is expected that a single programming pulse can be sufficient to increase the threshold voltage of the particular dummy memory cell. However, additional programming pulses could also be used.

At 615, each principal memory cell of a plurality of principal memory cells of the string of series-connected memory cells might be connected to the data line selectively connected to the string of series-connected memory cells, and might be isolated from the common source selectively connected to the string of series-connected memory cells. This might include applying pass voltages to all dummy access lines connected to dummy memory cells of the string of series-connected memory cells between any principal memory cell and the data line, e.g., dummy access lines $202d_3$-$202d_9$, and applying pass voltages to all principal access lines connected to principal memory cells of the string of series-connected memory cells. This might further include applying a voltage level to the corresponding drain select line 215 configured to activate its corresponding drain select gate, and applying a voltage level to the source select line 214 configured to deactivate its corresponding source select gate.

At 617, a second programming pulse (e.g., a single second programming pulse) might be concurrently applied to each principal memory cell of the plurality of principal memory cells sufficient to increase threshold voltages of at least a portion of the plurality of principal memory cells. This might include applying pass voltages to all dummy access lines connected to dummy memory cells of the string of series-connected memory cells between any principal memory cell and the data line, e.g., dummy access lines $202d_3$-$202d_9$, and applying the second programming pulse to all principal access lines connected to principal memory cells of the string of series-connected memory cells. This might further include applying a voltage level to the corresponding drain select line 215 configured to activate its corresponding drain select gate, and applying a voltage level to the source select line 214 configured to deactivate its corresponding source select gate.

At 619, the particular dummy memory cell and the plurality of principal memory cells (e.g., each principal memory cell of the plurality of principal memory cells) might be concurrently erased. Such erasure can be a standard erase operation used by the memory, and can further include erasing each dummy memory cell of the string of series-connected memory cells. Because of the changes effected by 613 and 617, erasing these memory cells might be part of standard housekeeping of the memory, e.g., as used in the reclamation blocks of memory cells containing obsolete data. Alternatively, erasing these memory cells at 619 might be performed immediately subsequent to 617.

Although the method of FIG. 6 was described with reference to a single string of series-connected memory cells, the method might be concurrently performed for each string of series-connected memory cells of a block of memory cells. For example, with reference to FIG. 3, the method might be performed concurrently for each string of series-connected memory cells having a source select gate connected to the source select line 214. Alternatively, the method might be performed concurrently for each string of series-connected memory cells having a drain select gate connected to a particular drain select line 215.

FIG. 7 is a method of operating a memory in accordance with a further embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 721, a first plurality of access lines and a second plurality of access lines might be electrically floated. Each access line of the first plurality of access lines might be connected to a respective memory cell of a string of series-connected memory cells. The respective memory cell for each access line of the first plurality of access lines might be configured for output of data using a read operation. Each access line of the second plurality of access lines might be connected to a respective memory cell of the string of series-connected memory cells. The respective memory cell for each access line of the second plurality of access lines might be configured to be inaccessible using the read operation. A first select line (e.g., a source select line) connected to a first select gate (e.g., a source select gate) at one end of the string of series-connected memory cells, and a second select line (e.g., a drain select line) connected to a second select gate (e.g., a drain select gate) at an opposite end of the string of series-connected memory cells, might also be electrically floated.

With reference to FIG. 3, the first plurality of access lines might correspond to the principal access lines $202a_0$-$202a_L$ and $202b_0$-$202b_U$. Similarly, the second plurality of access lines might correspond to the dummy access lines $202d_0$-$202d_9$.

At 723, a first programming pulse (e.g., a single first programming pulse) might be applied to a particular access line of the second plurality of access lines while electrically floating (e.g., continuing to electrically float) remaining access lines of the second plurality of access lines (e.g., all remaining access lines of the second plurality of access lines), and while electrically floating (e.g., continuing to electrically float) the first plurality of access lines (e.g., all access lines of the first plurality of access lines). The particular access line might correspond to the dummy access line $202d_0$.

At 725, a second programming pulse (e.g., a single second programming pulse) might be concurrently applied to each access line of the first plurality of access lines while applying pass voltages to each access line of the second plurality of access lines between any access line of the first plurality of access lines and an end of the string of series-connected memory cells opposite the particular access line. Continuing with the example, the access lines of the second plurality of access lines between any access line of the first plurality of access lines and an end of the string of series-connected memory cells opposite the particular access line might include dummy access lines $202d_3$-$202d_9$.

At 727, the respective memory cell for the particular access line and the respective memory cell for each access line of the first plurality of access lines might be concurrently erased. Such erasure can be a standard erase operation used by the memory, and can further include erasing the respective memory cell for each access line for the first plurality of access lines and the second plurality of access lines. Because of the changes effected by 723 and 725, erasing these memory cells might be part of standard housekeeping of the memory, e.g., as used in the reclamation blocks of memory cells containing obsolete data. Alternatively, erasing these memory cells at 727 might be performed immediately subsequent to 725.

Although the method of FIG. 7 was described with reference to a single string of series-connected memory cells, the access lines of the first plurality of access lines and the second plurality of access lines might each be connected to a respective memory cell for each of a plurality of strings of series-connected memory cells.

Figure 8:
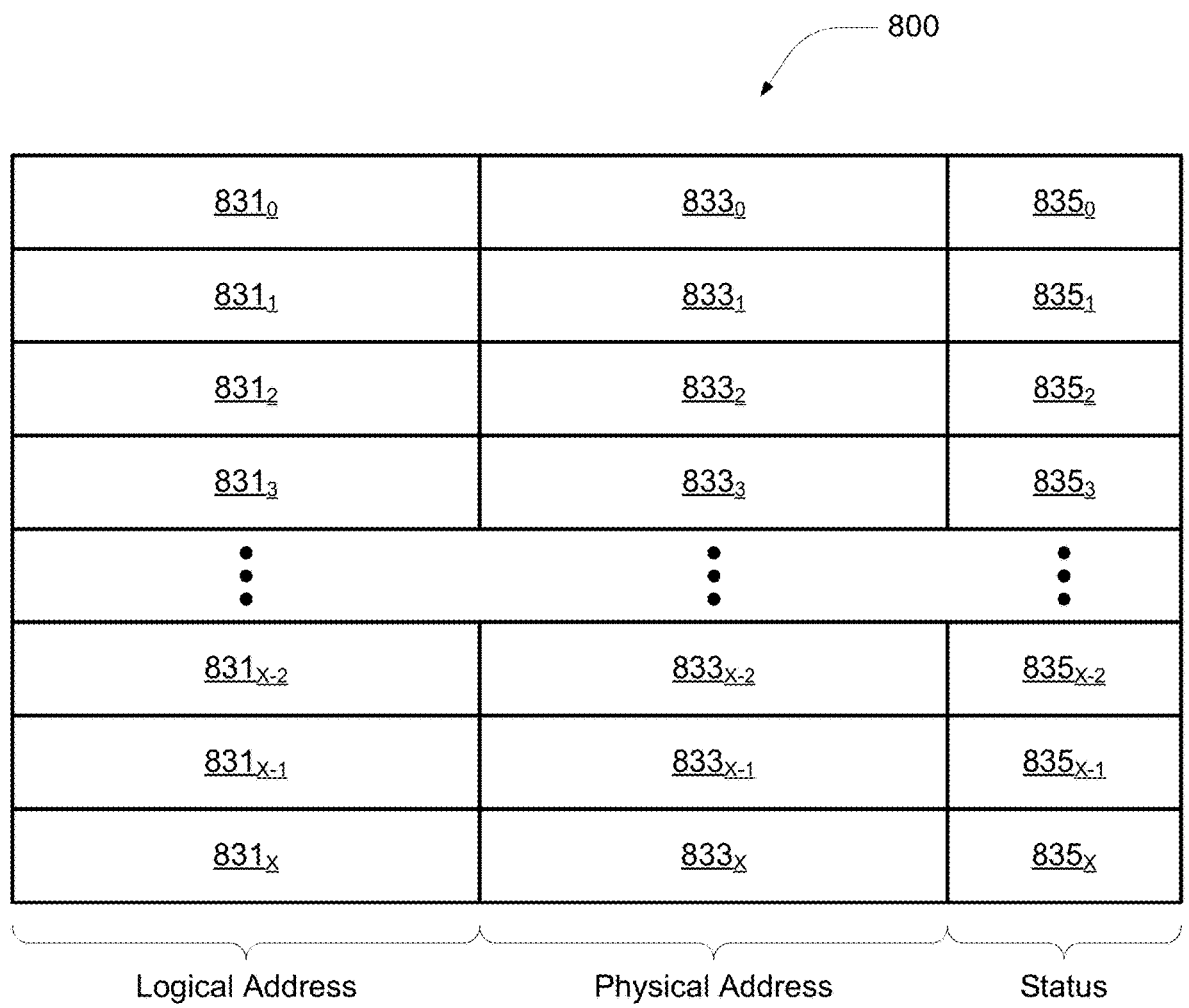
FIG. 8 is an example of a mapping table as could be used with various embodiments.

FIG. 8 is an example of a mapping table 800 as could be used with various embodiments. The mapping table 800 might include a plurality of logical address entries $831_0$-$831_X$, a corresponding plurality of physical address entries $833_0$-$833_X$, and a corresponding plurality of status entries $835_0$-$835_X$. Each logical address entry 831 might include information indicative of a logical address of a memory system, e.g., a memory module 101. Each physical address entry 833 might include information indicative of a physical address of the memory system, e.g., a physical address of a memory 100 of the memory system, corresponding to the corresponding logical address entry 831. Each status entry 835 might include information indicative of a status of a data destruction of the data stored in memory cells of the corresponding physical address entry 835.

Each status entry 835 might include one or more digits of information. A first (e.g., or only) digit of information of a status entry 835 might indicate whether data of the corresponding physical address entry 833 is designated for data destruction. For example, a first value (e.g., a logic high level) might indicate that no data destruction is desired, while a second value (e.g., a logic low level) might indicate that data destruction is desired. The value of the first digit of information might be set (e.g., to its second value) by a first controller of the memory system (e.g., a processor 130) in response to a command received from an external device, e.g., a host 150, indicating that data corresponding to a particular logical address should be destroyed. In response to the first digit of information of a particular status entry 835 having its second value, the first controller of the memory system might initiate a method of operating a memory in accordance with an embodiment for memory cells of the corresponding physical address entry 833. The first controller of the memory system might further delete the corresponding logical address entry 831 in response to the first digit of information having its second value.

A second digit of information of a status entry 835 might indicate whether the first programming pulse has been applied for memory cells corresponding to the corresponding physical address entry 833. For example, a first value (e.g., a logic high level) might indicate that the first programming pulse has not been applied, while a second value (e.g., a logic low level) might indicate that the first programming pulse has been applied. A second controller of the memory system (e.g., a control logic 116 for a memory 100 corresponding to the corresponding physical address entry 833) might update the status entry 835 after applying the first programming pulse.

A third digit of information of a status entry 835 might indicate whether the second programming pulse has been applied for memory cells corresponding to the corresponding physical address entry 833. For example, a first value (e.g., a logic high level) might indicate that the second programming pulse has not been applied, while a second value (e.g., a logic low level) might indicate that the second programming pulse has been applied. The second controller of the memory system might update the status entry 835 after applying the second programming pulse.

A fourth digit of information of a status entry 835 might indicate whether the memory cells corresponding to the corresponding physical address entry 833 have been erased. For example, a first value (e.g., a logic high level) might indicate that the memory cells have not been erased, while a second value (e.g., a logic low level) might indicate that the memory cells have been erased. The second controller of the memory system might update the status entry 835 after erasing the memory cells.

Where the mapping table 800 represents non-volatile storage locations, the status entries 835 might be used to recover from a power loss. As noted previously, a hold-up capacitance (e.g., capacitance 138) can provide power to a memory system for some finite amount of time in the case of failure or removal of a power supply. Applying the first programming pulse in accordance with various embodiments might have sufficiently low power requirements to permit making data inaccessible in a number of blocks of memory cells, even where a power loss event occurs after designating the memory cells for data destruction. However, there might not be sufficient remaining power to apply the second programming pulse, and/or to erase the memory cells. If a power loss event is experienced, the first controller, in response to restoration of power, might initiate the appropriate action in response to the various status entries 835. Where a status entry 835 contains only the first digit of information, the first controller might simply repeat the corresponding method in its entirety. Where additional status information is available, the first controller might start the corresponding method at the step that does not indicate completion.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
    a string of series-connected memory cells;
    a plurality of access lines, each access line of the plurality of access lines connected to a control gate of a respective memory cell of the plurality of memory cells; and
    a controller for access of the string of series-connected memory cells, wherein the controller is configured to cause the memory to:
        increase a threshold voltage of a particular memory cell of the string of series-connect memory cells to a voltage level higher than a predetermined pass voltage to be received by a control gate of the particular memory cell during a read operation on the string of series-connected memory cells; and
        concurrently change a respective data state of each memory cell of a plurality of memory cells of the string of series-connected memory cells.

2. The apparatus of claim 1, wherein a number of memory cells of the plurality of memory cells exceeds an error correction capability of an error correction scheme used by the memory.

3. The apparatus of claim 1, wherein the particular memory cell is closer to a particular end of the string of series-connected memory cells than any other memory cell of the string of series-connected memory cells.

4. The apparatus of claim 3, wherein the particular end of the string of series-connected memory cells is a source side of the string of series-connected memory cells.

5. The apparatus of claim 1, wherein the particular memory cell is inaccessible to a user of the memory.

6. The apparatus of claim 1, wherein the plurality of memory cells comprises each memory cell of the string of series-connected memory cells that is intended to store user data, and that has a threshold voltage lower than a particular voltage level.

7. The apparatus of claim 6, wherein the particular voltage level is above a mid-point of a read window for the string of series-connected memory cells.

8. The apparatus of claim 7, wherein the particular voltage level is above a value Vbot+0.75*(Vtop−Vbot), wherein Vbot is a lowest voltage level of the read window, and Vtop is a highest voltage level of the read window.

9. The apparatus of claim 1, wherein the controller is further configured to cause the memory to increase the threshold voltage of the particular memory cell using a single programming pulse applied to the control gate of the particular memory cell.

10. The apparatus of claim 9, wherein, for each memory cell of the plurality of memory cells, the controller is further configured to cause the memory to change the respective data state of that memory cell using a single programming pulse applied to the control gate of that memory cell.

11. An apparatus, comprising:
    a string of series-connected memory cells comprising a first memory cell and a plurality of second memory cells;
    a plurality of access lines, each access line of the plurality of access lines connected to a control gate of a respective memory cell of the string of series-connected memory cells; and
    a controller for access of the string of series-connected memory cells, wherein the controller is configured to cause the apparatus to:
        apply a first programming pulse to the access line of the plurality of access lines connected to a control gate of the first memory cell, wherein the first programming pulse has a voltage level sufficient to increase a threshold voltage of the first memory cell to a voltage level sufficient to cause the first memory cell to remain deactivated during a read operation on the string of series-connected memory cells; and concurrently apply a second programming pulse to each access line of the plurality of access lines connected to a control gate of a second memory cell of the plurality of second memory cells, wherein the second programming pulse has a voltage level sufficient to increase threshold voltages of at least a portion of the plurality of second memory cells.

12. The apparatus of claim 11, wherein the controller is further configured to cause the apparatus to:
concurrently erase the first memory cell and the plurality of second memory cells.

13. The apparatus of claim 11, wherein a voltage level of the second programming pulse is lower than a voltage level of the first programming pulse.

14. The apparatus of claim 11, wherein the voltage level of the second programming pulse is sufficient to increase the threshold voltages of at least half of the second memory cells of the plurality of second memory cells.

15. The apparatus of claim 11, wherein each second memory cell of the plurality of second memory cells is configured for output of data during a respective read operation, and wherein the first memory cell is configured to be inaccessible during a read operation.

16. The apparatus of claim 11, wherein the first memory cell is closer to a particular end of the string of series-connected memory cells than any other memory cell of the string of series-connected memory cells.

17. The apparatus of claim 16, wherein the particular end of the string of series-connected memory cells is a source-side end of the string of series-connected memory cells.

18. The apparatus of claim 17, wherein the controller is further configured to cause the apparatus to isolate the particular end of the string of series-connected memory cells from a common source while concurrently applying the second programming pulse to each second access line of the plurality of second access lines.

19. An apparatus, comprising:
a first controller; and
a memory in communication with the first controller, wherein the memory comprises:
a string of series-connected memory cells connected between a common source and a data line and comprising a plurality of principal memory cells and a plurality of dummy memory cells;
a plurality of dummy access lines, each dummy access line of the plurality of dummy access lines connected to a control gate of a respective dummy memory cell of the plurality of dummy memory cells;
a plurality of principal access lines, each principal access line of the plurality of principal access lines connected to a control gate of a respective principal memory cell of the plurality of principal memory cells; and
a second controller for access of the string of series-connected memory cells, wherein the second controller is configured to cause the memory to:
connect a particular dummy memory cell of the plurality of dummy memory cells to the common source and isolate the particular dummy memory cell from the data line;
increase a threshold voltage of the particular dummy memory cell of the plurality of dummy memory cells to a voltage level higher than a predetermined pass voltage to be received by a control gate of the particular dummy memory cell during a read operation on the string of series-connected memory cells;
isolate each principal memory cell of the plurality of principal memory cells from the common source and connect each principal memory cell of the plurality of memory cells to the data line; and
concurrently change a respective data state of a subset of principal memory cells of the plurality of principal memory cells, wherein the subset of principal memory cells comprises more than one principal memory cell of the plurality of principal memory cells.

20. The apparatus of claim 19, further comprising:
trim registers;
wherein information indicative of a voltage level of the predetermined pass voltage is stored to the trim registers.

21. The apparatus of claim 20, wherein the information indicative of the voltage level of the predetermined pass voltage that is stored to the trim registers is inaccessible to a user of the apparatus.

22. The apparatus of claim 19, wherein the second controller being configured to cause the memory to isolate each principal memory cell of the plurality of principal memory cells from the common source comprises the second controller being configured to cause the memory to deactivate a select gate between the plurality of principal memory cells and the common source.

23. The apparatus of claim 22, wherein the second controller being configured to cause the memory to isolate each principal memory cell of the plurality of principal memory cells from the common source further comprises the second controller being configured to cause the memory to deactivate the particular dummy memory cell.

24. The apparatus of claim 19, wherein the first controller comprises a mapping table comprising a status entry indicative of a status of data destruction of data stored in the string of series-connected memory cells.

* * * * *